(12) United States Patent
Hata et al.

(10) Patent No.: US 7,153,758 B2
(45) Date of Patent: Dec. 26, 2006

(54) ANODIC BONDING METHOD AND ELECTRONIC DEVICE HAVING ANODIC BONDING STRUCTURE

(75) Inventors: Shohei Hata, Yokohama (JP); Hideo Sotokawa, Yokohama (JP); Hiroaki Furuichi, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 63 days.

(21) Appl. No.: 10/786,106

(22) Filed: Feb. 26, 2004

(65) Prior Publication Data

US 2004/0197949 A1 Oct. 7, 2004

(30) Foreign Application Priority Data

Feb. 28, 2003 (JP) .............................. 2003-053410

(51) Int. Cl.
*H01L 21/326* (2006.01)
*B32B 37/00* (2006.01)

(52) U.S. Cl. .................... 438/455; 438/470; 156/272.2

(58) Field of Classification Search ................ 438/456, 438/470; 156/272.2
See application file for complete search history.

(56) References Cited

U.S. PATENT DOCUMENTS 4,712,082 A * 12/1987 Ito et al. ......................... 338/4
5,313,832 A * 5/1994 Stephan et al. ........... 73/204.26
6,417,478 B1 * 7/2002 Shiraishi et al. ......... 219/78.02
6,939,778 B1 * 9/2005 Harpster et al. ............ 438/406
2003/0175530 A1 * 9/2003 Ko et al. ..................... 428/432
2005/0089924 A1 * 4/2005 Ho et al. ..................... 435/7.1

FOREIGN PATENT DOCUMENTS

JP 10-259039 9/1998

* cited by examiner

*Primary Examiner*—Carl Whitehead, Jr.
*Assistant Examiner*—Jennifer M Dolan
(74) *Attorney, Agent, or Firm*—Antonelli, Terry, Stout and Kraus, LLP.

(57) ABSTRACT

In anodic bonding between a conductor or semiconductor and glass, in order to attain good adhesion at a lower bonding temperature than usual and improve the toughness at its boundary to obtain higher reliability for a bonded portion even in a case where bonded members are warped or dust is present at the bonding boundary, a soft metal film is formed on the surface of a conductor or semiconductor on which an active metal film having high reactivity with oxygen is formed, whereby a warp or dust, if any, can be absorbed by the deformation of the soft metal film, thereby to improve the adhesion at the boundary. Adhesion at the bonding boundary is improved even at a low bonding temperature of, e.g., about 200° C. Further, the toughness at the bonding boundary can be improved to increase reliability by roughening the bonded surface on the side of the glass.

5 Claims, 10 Drawing Sheets

ANODIC BONDING METHOD AND ELECTRONIC DEVICE HAVING ANODIC BONDING STRUCTURE

CROSS REFERENCE TO RELATED APPLICATION

The disclosure of Japanese Patent Application No. JP2003-053410, filed on Feb. 28, 2003, including the specification, drawings and abstract thereof, is incorporated herein by reference in its entirety.

BACKGROUND OF THE INVENTION

The present invention relates to an electronic device having an anodic bonding structure consisting of a conductor or semiconductor and glass; and, more particularly, the invention relates to a micro-machine technique, including the use of micro-sensors and micro-pumps, and to an optical component.

Since anodic bonding can be employed to directly bond a semiconductor, such as Si, and glass, it is used mainly in the field of MEMS (Micro Electro Mechanical Systems) for the manufacture of micro-mechanical components by fabrication of Si. Since the principle of anodic bonding is reported in a significant amount of literature, such as Japanese Patent Laid-open No.10-259039, only an outline thereof will be described here.

When glass and Si are brought into contact with each other, and a DC voltage is applied using glass as a cathode and Si as an anode along with heating, positive cations contained in the glass are compulsorily diffused to the cathode to form a cation depletion layer near the bonding boundary with the Si. As a result, the cation depletion layer is rendered relatively anion rich where negative charges are accumulated, while positive charges are accumulated on the side of the Si with the bonding boundary being disposed therebetween, so that a large electrostatic attraction force is generated between the glass and the Si, thereby to cause bonding. Further, it has been known that not only the electrostatic attraction, but also a chemical reaction at a boundary between the Si and the glass exert a significant effect on the bonding force. This effect is described also in Japanese Patent Laid-open No. 10-259039.

Typical examples in which anodic bonding is actually applied include components of various kinds of sensors, such as pressure sensors, acceleration sensors and angular velocity sensors, or micro-pumps, typically represented by the inkjet nozzles of inkjet printers. These components are manufactured at first by applying anisotropic etching to the Si, and then by anodic bonding the same to a separate glass layer. The anodic bonding technique has been adopted for the products described above, since anodic bonding can directly bond Si and glass so as to enable extremely sensitive detection of a change in external pressure, etc.

The concepts involved will be explained by way of example with reference to a pressure sensor. In a pressure sensor, a recess is formed at a portion of a Si layer by anisotropic etching. The bottom portion of the recess of the Si layer is fabricated so as to be thin to such an extent that it is capable of being distorted by an external pressure. At this point, a resistor, such as a strain gauge, is formed at the thin bottom portion of the recess of the Si layer, and then the Si layer and a glass layer are anodically bonded to each other. A cavity having a volume corresponding to that of the recess formed by anisotropic etching is defined between the glass layer and the Si layer at the bottom of the recess, so that the thin Si layer will be distorted at the bottom of the recess in response to a change in the external pressure. Thus, the thin Si layer is distorted at the bottom of the recess in response to a change in the external pressure, by which the resistivity of the strain gauge changes, so that a change of pressure can be taken out instantaneously as an electrical signal.

Direct bonding of glass and Si has an advantage in that the change of external pressure, if it occurs, is directly transmitted to the Si layer. On the other hand, in a case where Si and glass are bonded together by using a bonding agent having a low elasticity, the deformation due to the change of external pressure, if any, is absorbed in the bonding agent and the deformation of Si per se is small, or the signals derived therefrom become instable. Further, since the devices described above are so extremely small that they are usually difficult to handle individually, they are fabricated and bonded while still in the wafer state. Wafers can be positioned and bonded with high accuracy, and anodic bonding is suitable to the fabrication of such products also in view of the fabrication processes. These are some of the reasons why anodic bonding has been used generally in the fabrication of various kinds of sensor components.

However, since anodic bonding employs a technique in which the wafers are bonded to each other in a solid state, if dust is present between the Si and glass layers, or the wafers include undulations, many voids are formed at the bonding boundary, which can lead to a bonding failure. In a case where the quantity of dust or the size of the wafer undulations is small, since the glass itself undergoes some deformation by heating it to or above a softening temperature, the occurrence of voids at the boundary may possibly be suppressed somewhat. However, the deformation of glass is usually small, and so dust or wafer undulations still tend to deteriorate the quality of the bonding.

In order to solve such a problem, Japanese Patent Application No. 10-259039 discloses a technique of incorporating a metal layer that forms eutectics with a conductor or semiconductor at a temperature lower than the softening point of a glass layer, whereby the adhesion between the glass and Si layers is improved by utilizing this technique. This document discloses a technique in which Au metallization is applied specifically to a surface of the Si layer, which is heated to or above 363° C. as an eutectic temperature of Au—Si to form molten eutectics, thereby closely bonding the boundaries, irrespective of the presence of dust or undulations on the boundaries. What is important in this technique is to liquefy the surface of the Si layer upon bonding, thereby absorbing the wafer undulations or dust into the liquid and increasing the adhesion between the wafers. That is, this technique inevitably requires liquid to be formed at the bonding boundaries.

SUMMARY OF THE INVENTION

At a bonding temperature of about 400° C., there are ways of forming molten eutectics with Si. However, in case it is intended to bond a Si wafer at a temperature, for example, of 300° C. or lower, such molten eutectics cannot be formed. This is because no way has been found to form molten liquids with Si at a temperature of 300° C. or lower, even when metal devices capable of forming eutectics with Si are sought with reference to a binary system equilibrium phase diagram. Accordingly, a new technique is necessary for conducting anodic bonding at such a lower temperature.

Anodic bonding is a technique that is capable of bonding glass and a conductor or a semiconductor without using a bonding agent, and it is a technique that is also capable of effecting bonding in a wafer state with a high degree of positional accuracy. Accordingly, it is expected that this technique will be developed for application in various fields in the future, as well as for the production of sensor components as described above. For example, it is believed that this technique is applicable also to the mounting of lenses or sealing glasses in optical components, e.g., electronic devices and semiconductor devices, of mounting a light emitting device or photo-receiving device on an Si bench for use in optical components fabricated by anisotropic etching. However, in order to apply the anodic bonding technique to such products, it is necessary to perform bonding at a temperature lower than usual. The reason for this will be described below.

Au-20Sn solder or a Sn-based solder, having a melting point of 183° C. to 240° C., is used for the mounting of light emitting or photo-receiving devices. To make the mounting of the optical devices and the anodic bonding between a lens or sealing glass and Si compatible with each other, it is necessary to lower the temperature used in the anodic bonding to such a level as to not cause melting of the solder used for the device bonding. When the solder at the device-bonding portion is melted, the device may move or react with an electrode metallized portion in the connection portion, thereby damaging the metallized portion.

With an aim of lowering the bonding temperature used in the anodic bonding, an improvement in the close adhesion state between wafers and a reaction at the boundary have been noted.

It is an object of the present invention to improve the close adhesion between a glass layer and a conductor layer or semiconductor layer at a bonding temperature that is lower than usual, to promote chemical reaction at the boundary between both components and to obtain a firm and highly reliable anodic bonding therebetween.

The foregoing and other objects and novel features of the invention will become more apparent with reference to the description provided the present specification and from the accompanying drawings.

According to the technique employed in accordance with the present invention, good close adhesion can be attained for a glass layer and a conductor layer or a semiconductor layer at a lower bonding temperature than usual, and bonding which is firm also from a chemical point of view can be obtained by use of an active metal. As a means of obtaining good close adhesion, a soft metal layer is disposed on the surface of a conductor or semiconductor. Thus, when the glass and the conductor or semiconductor are attracted to each other by an electrostatic attraction force, even in a case where dust or undulations are present on the boundary, the soft metal layer is deformed so as to provide good close adhesion. In a case of using Sn or Pb, or when an alloy containing them is used, as the soft metal layer, they may be possibly melted during bonding. However, even when they are melted, since a pure metal layer containing at least one of Cu, Ni, Pt, Pd, Ti and Cr or an alloy thin film containing at least one of them is formed previously between the film and the active metal layer, diffusion and reaction with respect to the active metal layer can be prevented, and the bonding is not deteriorated. Further, in order to improve the bonding strength with the glass in the course of anodic bonding, it is effective to roughen the bonding surface of the glass layer, thereby increasing the anchoring effect. In the bonding between hard solids, such as glass and Si, the bonding area is generally decreased as the bonding face is roughened, thereby failing to obtain a firm bonding. However, according to the invention, the soft metal layer formed on the conductor or semiconductor surface deforms so as to conform to the shape of the roughened glass, and thus the conductor or the semiconductor can be firmly bonded to the glass, also chemically due to the active metal on the surface.

DETAILED DESCRIPTION OF THE PREFERRED EMBODIMENTS

Figure 1:
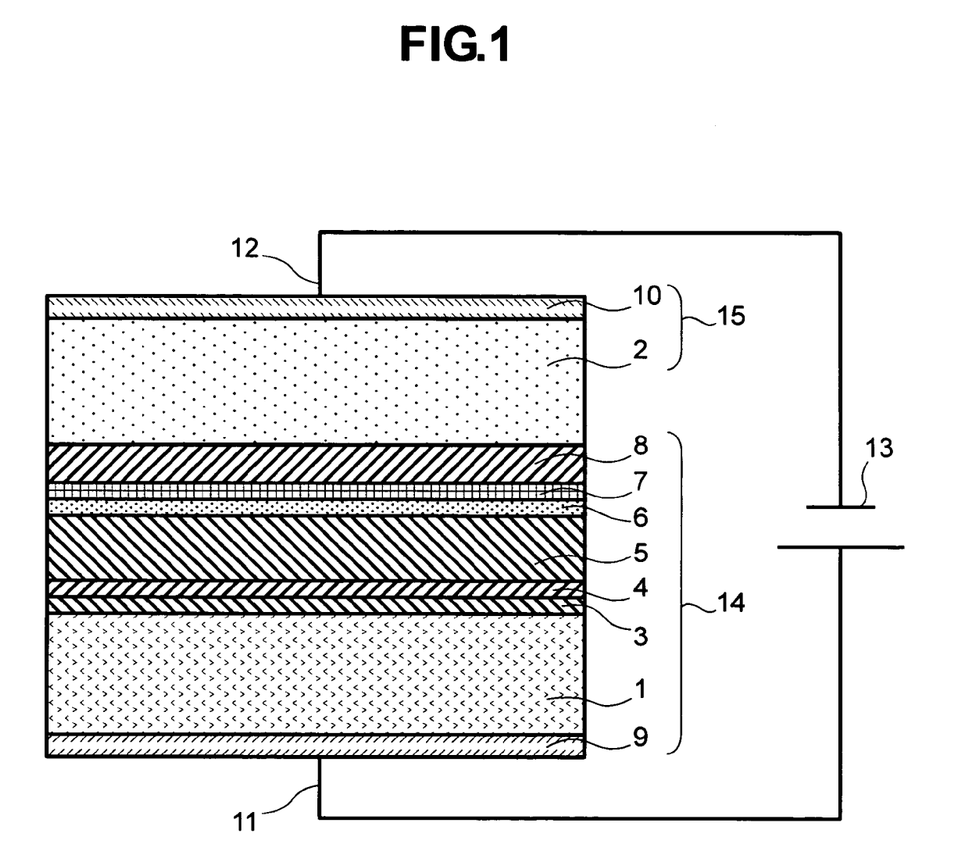
FIG. 1 is a cross-sectional diagram showing a first embodiment of the present invention.

A first embodiment of the invention will be described with reference to FIG. 1. On a Si layer 1, a Ti film 3, a Pt film 4 and an Au film 5 are formed by vacuum vapor deposition or sputtering. The Ti film 3 has a function of improving the adhesion with the Si layer 1. The Pt film 4 has a function of improving the adhesion between the Au film 5 and the Ti film 3. The Au film 5 has a function, as a soft metal layer, of improving the adhesion with glass through deformation at the time of anodic bonding. The description of this embodiment makes reference by way of example to the use of Au as a representative of the type of soft metal that may be employed, but the soft metal layer is not restricted to the use of Au. Although, depending on the bonding temperature, Au, Ag, Cu, Pb or Sn is extremely soft even at a temperature of about 200° C. and shows sufficient deformation. Accordingly, in a case of using such a soft metal, it can be deformed sufficiently even if dust or wafer undulations are present more or less on the bonding boundary, thereby removing the undesired effects thereof. In comparison with the above-mentioned materials that, Pt, Pd, Ni or the like is slightly harder, but still has an effect of improving the bondability in a case where the quantity of dust or the size of the wafer undulations present is somewhat small.

Then, a Pt film 6, is formed by vacuum vapor deposition or sputtering. Further, a Ti film 7 and an Al film 8 are formed. In this embodiment, the Au film 5 is used as the soft metal film, and an Al film 8 is used as the active metal film.

In this case, when the Al film 8 and the Au film 5 are stacked directly, Al and Au react chemically to each other to form a fragile intermetallic compound, causing boundary peeling or the like. This is a known phenomenon, generally referred to as purple plague, which occurs known in the wire bonding of an Al electrode film and an Au wire. Accordingly, the Pt film 6 and the Ti film 7 are interposed therebetween in order to suppress the reaction and obtain good adhesion.

While Al is used as the typical active metal, which has high affinity with oxygen, the active metal is not restricted to Al. Bondability can be improved also with other metals, such as Cr, Ti, V. W or the like.

It is preferred that, for the thickness of these films, the Ti film 3 is about 0.1 μm, the Pt film 4 is about 0.2 μm, the Au film 5 is about 0.5 to 10 μm, the Pt film 6 is about 0.2 μm, the Ti film 7 is about 0.1 μm, and the Al film 8 is about 0.5 to 5 μm, but other thicknesses may also be used. In particular, the thickness of the Au film 5 varies depending on the size of dust or wafer undulations present on the bonding boundary, and, therefore, the film thickness has to be increased as the size thereof is larger.

An Si substrate 14, having the bonding layer structure as described above, and an anode film 9 formed on the side opposite to the bonding surface, and a glass substrate 15 having a cathode film 10 formed on the side opposite to the bonding surface are brought into close contact with each other, and they are connected to an anode terminal 11 and a cathode terminal 12, respectively, from a power source 13. They are bonded by heating them to about 250° C. and, further by applying a DC voltage at several hundred volts thereto.

Figure 2:
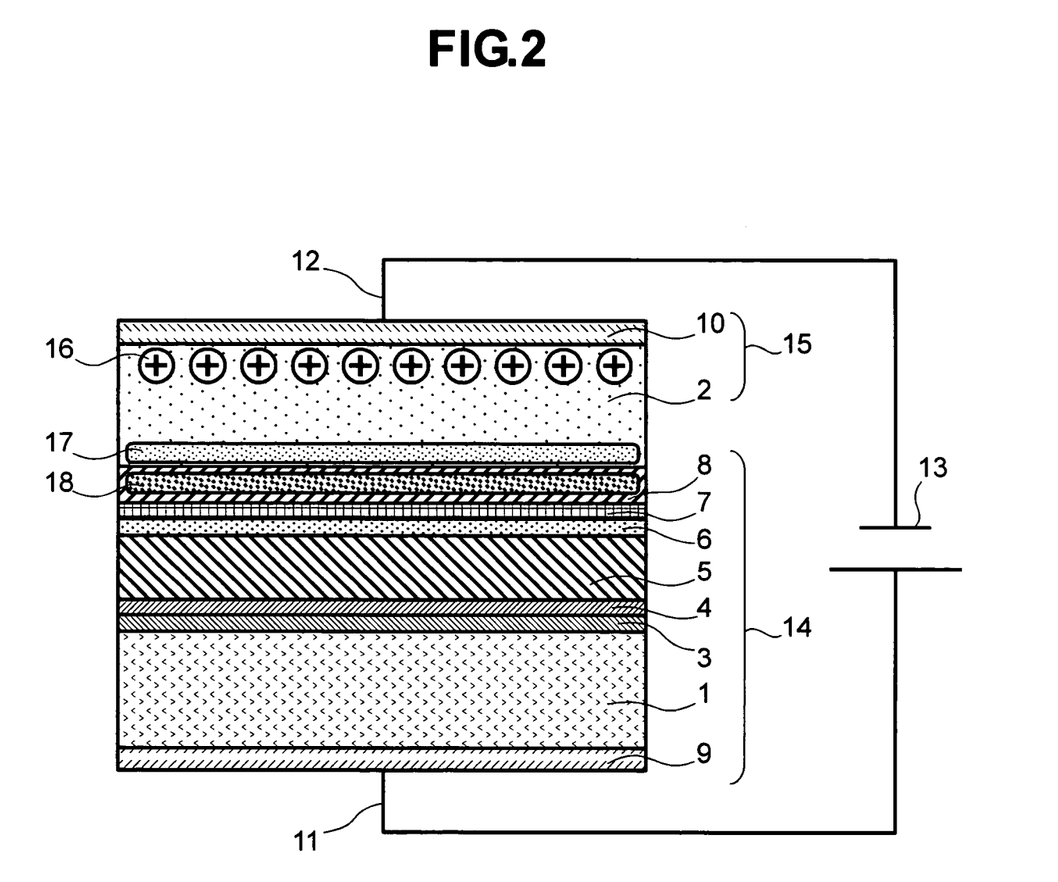
FIG. 2 is a cross-sectional diagram showing a bonding mechanism according to the first embodiment of the invention.

The bonding mechanism which occurs during the anodic bonding will be described with reference to FIG. 2. In the constitution of FIG. 1, when a DC voltage is applied along with heating, cations 16 in the glass are diffused toward the cathode film 10. Thus, a cation depletion layer is formed near the bonded face so as to form a portion appearing as a negatively charged region 17 on the other side of glass. A cationically charged region 18 is formed on the side of the Si substrate near the bonding boundary in the Al film 8 on the side of the Si substrate 14 and it is attracted to the region 17. The Si substrate 14 and the glass substrate 15 are bonded to each other by the electrostatic attraction between the regions 17 and 18. At the same time, the Al film 8 tends to bond oxygen together in the glass 2 to cause a chemical bonding.

Figure 3:
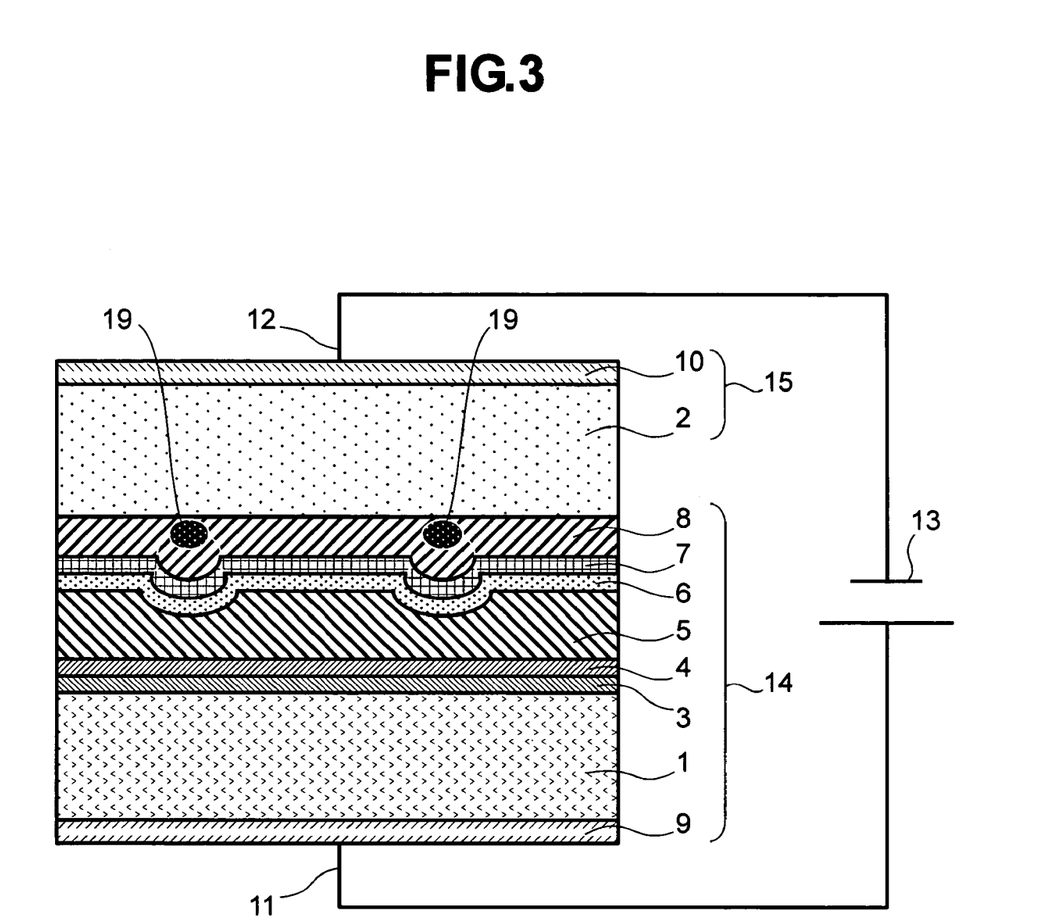
FIG. 3 is a cross-sectional diagram showing another bonding mechanism according to the first embodiment of the invention.

FIG. 3 is a view showing a bonding mechanism which occurs in a case where inclusions 19, such as dust, are present between the Si substrate 14 and the glass substrate 15. The Al film 8, the Ti film 7, the Pt film 6 and the Au film 5 are deformed in accordance with the volume of the inclusions 19. Thus, the Si substrate 14 and the glass substrate 15 are bonded to each other with gaps scarcely formed on the periphery of the inclusions 19.

Figure 4:
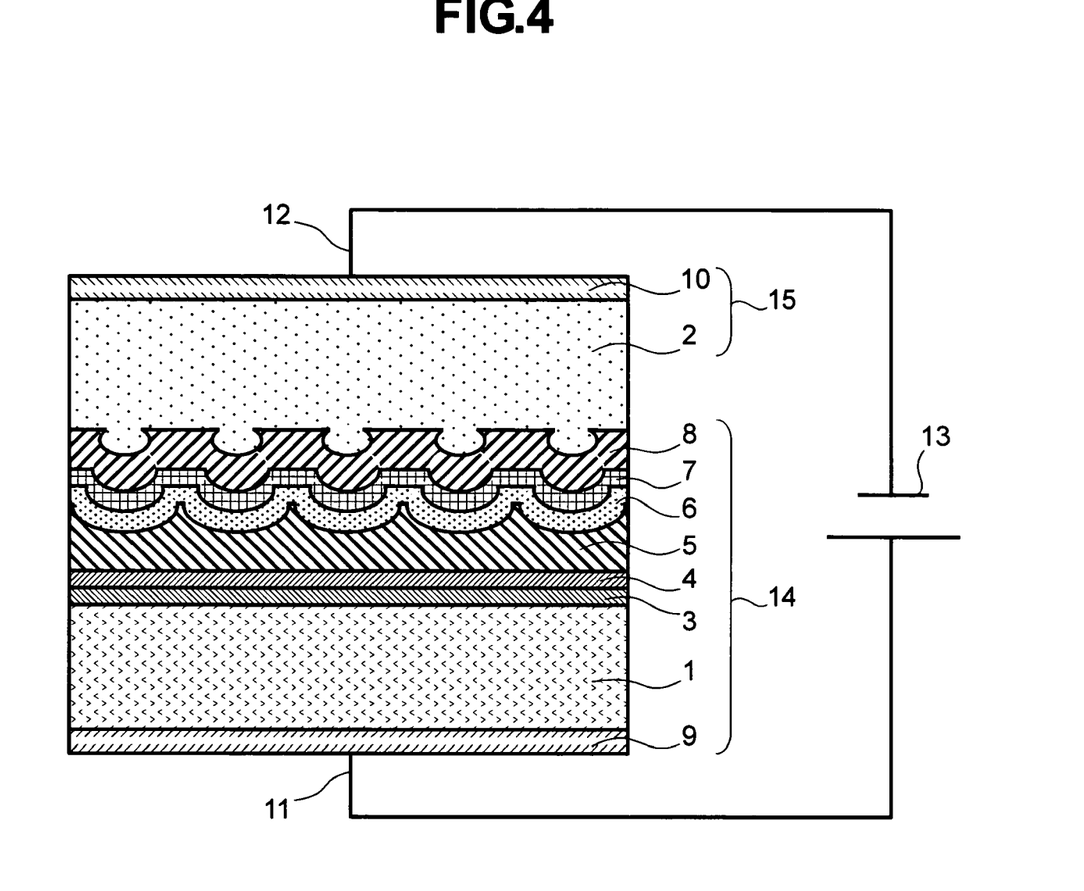
FIG. 4 is a cross-sectional diagram of a bonding mechanism according to a second embodiment of the invention.

A second embodiment of the invention will be described with reference to FIG. 4. This shows an example in which the bonded face of the glass 2 in the first embodiment has been roughened. The boundary between the glass 2 and the Al film 8 is undulated by the roughening of the glass surface in the order of microns, causing an anchoring effect. This can further improve the toughness of the boundary, and the Si substrate 14 and the glass substrate 15 are anodically bonded to each other firmly.

Figure 5:
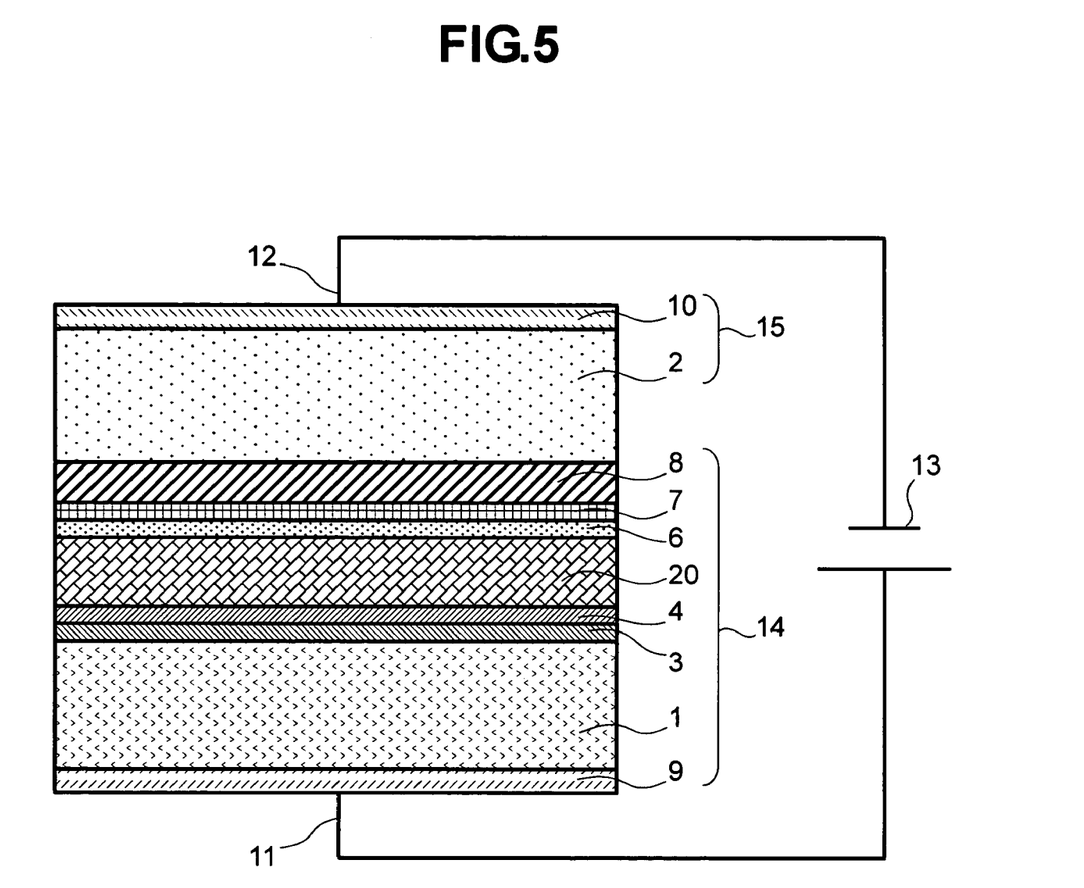
FIG. 5 is a cross-sectional diagram of a bonding mechanism according to a third embodiment of the invention.

A third embodiment of the invention will be described with reference to FIG. 5. In this embodiment, an Sn film 20 is formed instead of the Au film 5 as the soft metal layer. In a case where anodic bonding is performed at a temperature of 232° C. or lower, the Sn film is not melted, and, in principle, bonding is performed in the same manner as in the first and second embodiments of the invention. In a case where the temperature of the anodic bonding is 232° C. or higher, the Sn film is melted. In this case, when inclusions are present at the boundary or the surface of the glass 2 is roughened, the Al film 8, the Ti film 7, the Pt film 6, arid the Sn film 20 are deformed so as to conform thereto. Since diffusion of Sn is prevented by the Pt film 4 and the Pt film 6 located on both the surfaces of the Sn film 20, this can prevent Sn from diffusing toward the Al film 8 to form a fragile intermetallic compound, thereby deteriorating the strength. Consequently, a firm bonding can be attained.

Usually, a connection by melting Sn or the like is referred to as soldering. In this embodiment, no metallized portions are simply formed on the wafer and the glass, and the Sn film is melted in a process of anodic bonding without performing soldering. This is because soldering between the fabricated wafer and the glass substrate would require a pressure for obtaining uniform bonding over the entire surface of the wafer, which may possibly exude the solder, thereby to damage the circuit portion or the sensor portion formed at a portion of the wafer. However, when the amount of solder is decreased in order to suppress any exudation, the number of unconnected portions tends to increase. Accordingly, when the thickness of the Sn film is defined to such an extent as to be capable of avoiding the effects of undulations or dust on the surface and anodic bonding is performed in this state, as in this embodiment, the entire wafer surface can be bonded without causing breakage due to the exudation of solder.

Figure 6:
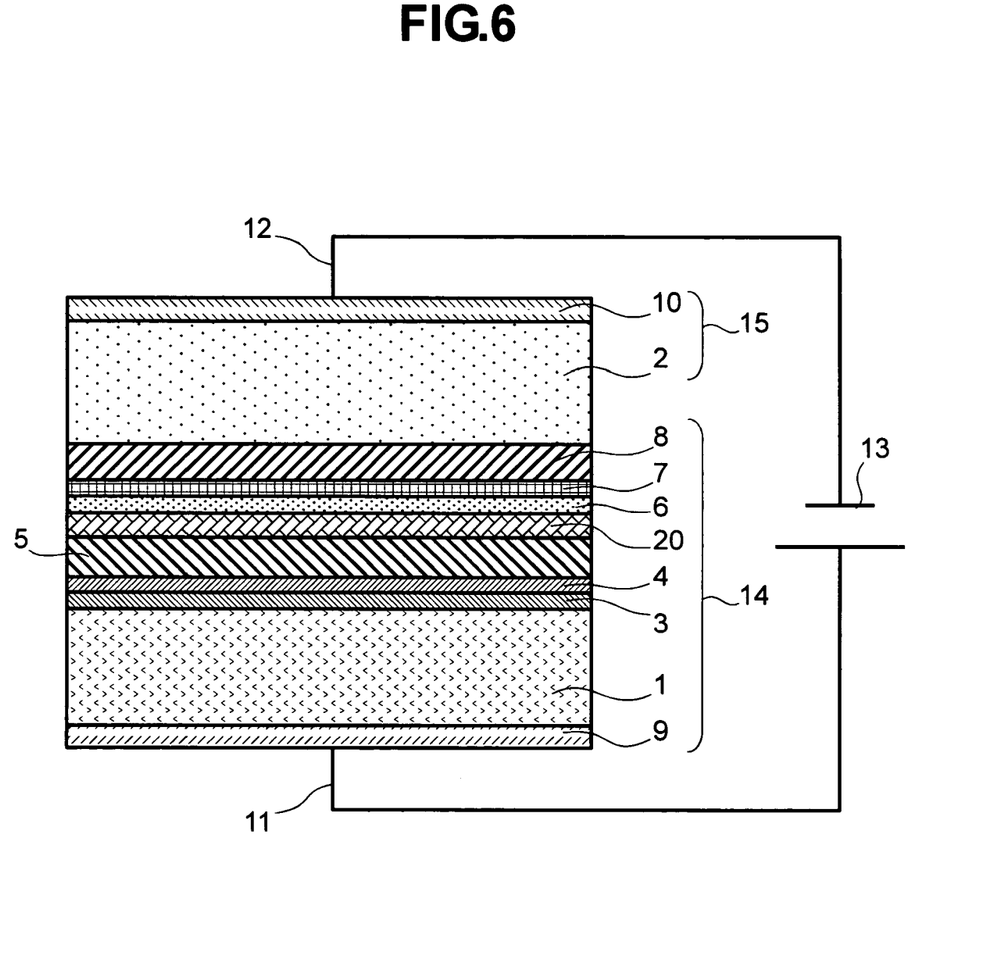
FIG. 6 is a cross-sectional diagram of a bonding mechanism according to a fourth embodiment of the invention.

A fourth embodiment of the invention will be described with reference to FIG. 6. A stack of an Au film 5 and an Sn film 20 is used as the soft metal layer. When the stack is heated at a bonding temperature of, e.g., 300° C., the Sn film 20 is melted, and, immediately thereafter, the Al film 8, the Ti film 7 and the Pt film 6 are deformed in such a manner as to conform the surfaces of inclusions and the glass 2. Subsequently, diffusion of cations in the glass is promoted by the application of voltage for anodic bonding. During heating, the Sn film 20 is instantly diffused into the Au film 5 to form an Au—Sn alloy. If the original thickness of the Au film 5 and the Sn film 20 is designed for the Au—Sn alloy such that the average composition has an Sn concentration of Au-12% Sn or less, the portion is not melted even when heated at 280° C. or higher in the subsequent process. That is, the film is melted temporarily in order to obtain good adhesion upon anodic bonding, and then the melting point is made higher to improve the heat resistance. In this case, melting at the anodically bonded portion can be prevented even when soldering is applied by using Au-20Sn solder after the anodic bonding.

Figure 7:
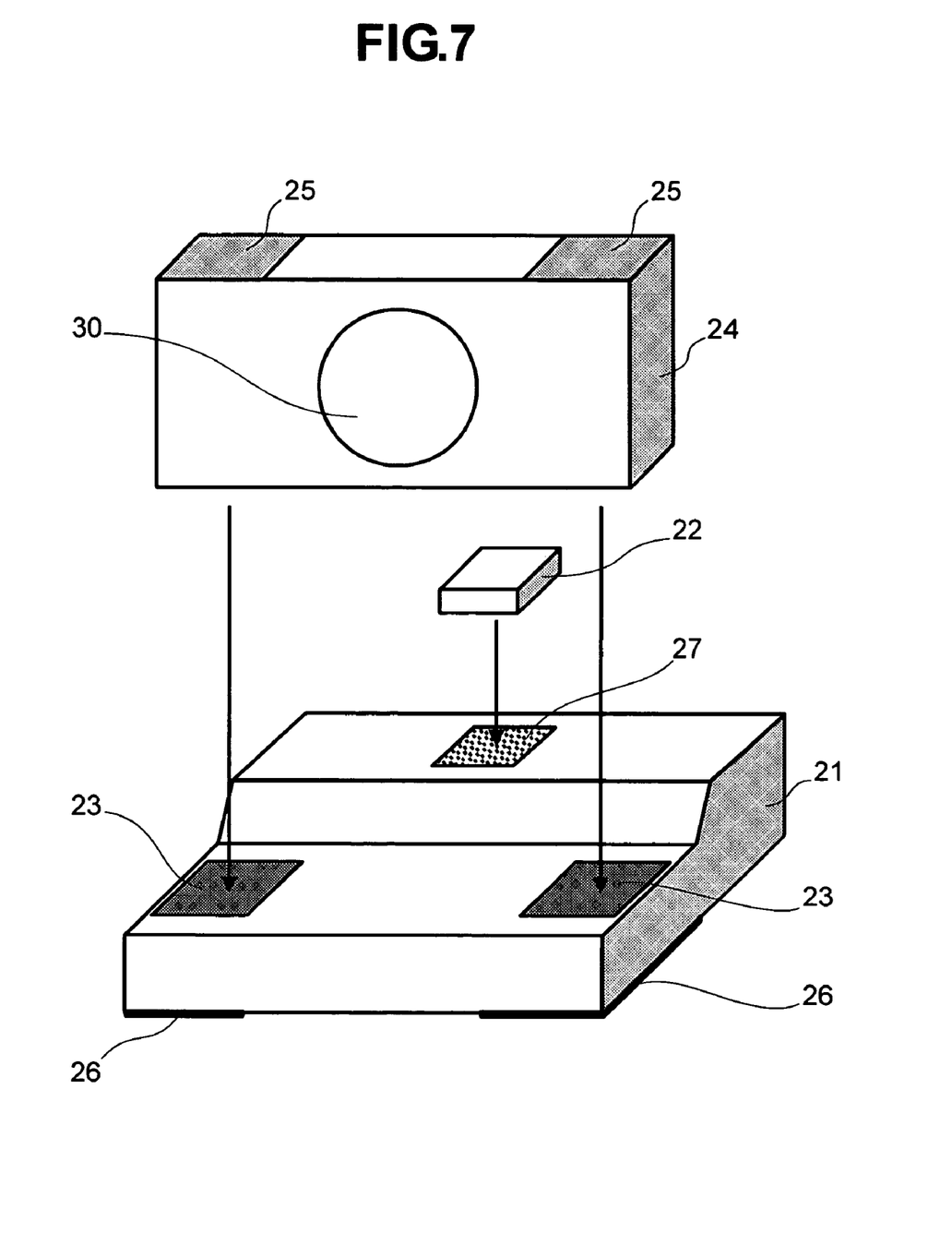
FIG. 7 is a developed perspective view illustrating a fifth embodiment in which the invention is applied to a product.

A fifth embodiment of the invention will be described with reference to FIG. 7. Metal films 23 for anodic bonding are provided in such a manner as to be connected to a lens 24 at portions other than at a light transmission portion 30 of the lens 24. An anode film 26 at the lower surface of a Si bench 21 may be provided over the entire surface of the Si bench 21 with no problem depending on the bonding conditions. However, if it is located at a position corresponding to the position of the metal film 23 at the back surface of the Si bench 21 and a cathode film 25 on the side of the lens 24 is also located at a position corresponding to the position of the metal film 23, while a DC voltage is concentratedly applied to this portion, and diffusion of ions in the lens 24 is restricted to a portion other than the light transmission portion. Accordingly, mounting can be performed while avoiding the effect of a delicate change of the refractive index caused by the diffusion of ions in the lens.

In the mounting process, at first, the lens 24 is positioned exactly and pressed to the metal film 23 on the Si bench 21. In this state, they are heated to about 200° C. and anodic bonding is performed by applying a DC voltage thereto. Then, an optical device 22 is positioned exactly and pressed to a solder film 27, and the solder film 27 is melted so as to mount the optical device 22 onto the Si bench 21. In a case of mounting using such a structure, it is possible to mount a lens array in the wafer state before cutting the Si bench.

Figure 8:
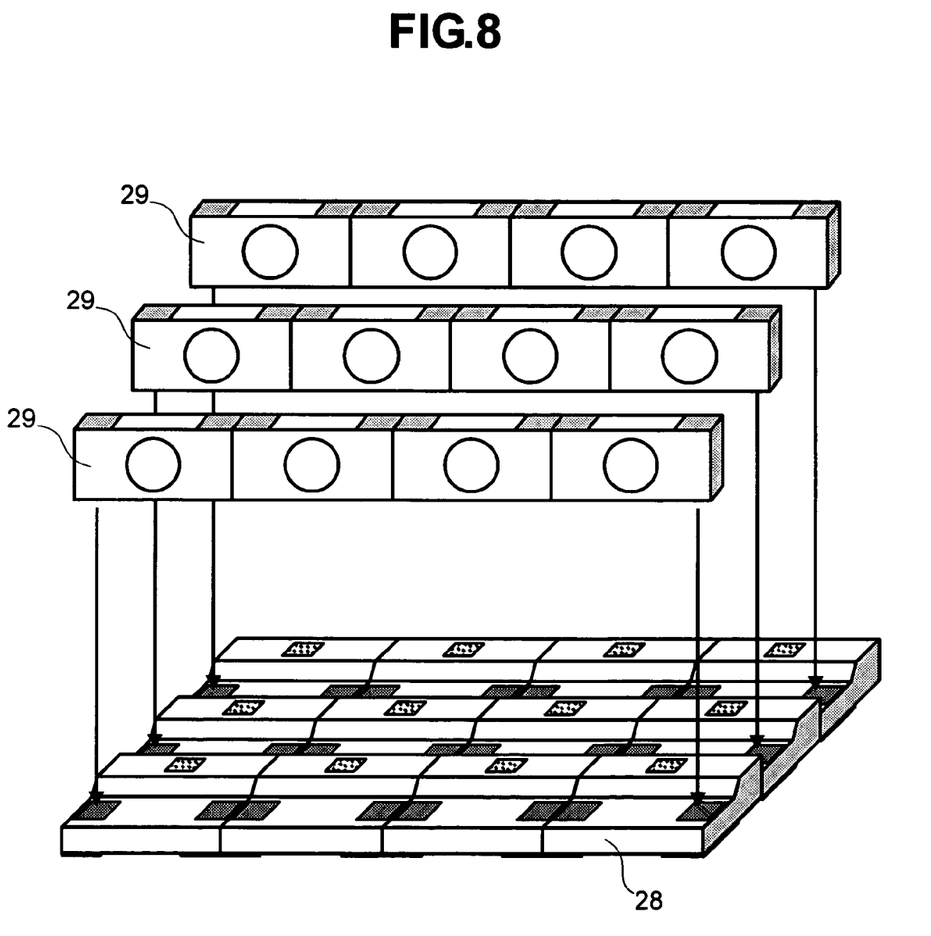
FIG. 8 is a developed perspective view illustrating a sixth embodiment in which the invention is applied to another product.

FIG. 8 shows a view of a sixth embodiment of the present invention. The Si bench described in connection with the fifth embodiment is arranged in a wafer state 28, which is a state before the Si benches are cut individually, and lens arrays 29 are anodically bonded to the wafer. Subsequently, they are cut into individual Si benches by dicing, and then optical devices are mounted individually onto the Si benches. This can decrease the time for the lens connection bonding step and the time for positioning, thereby improving productivity.

Figure 9:
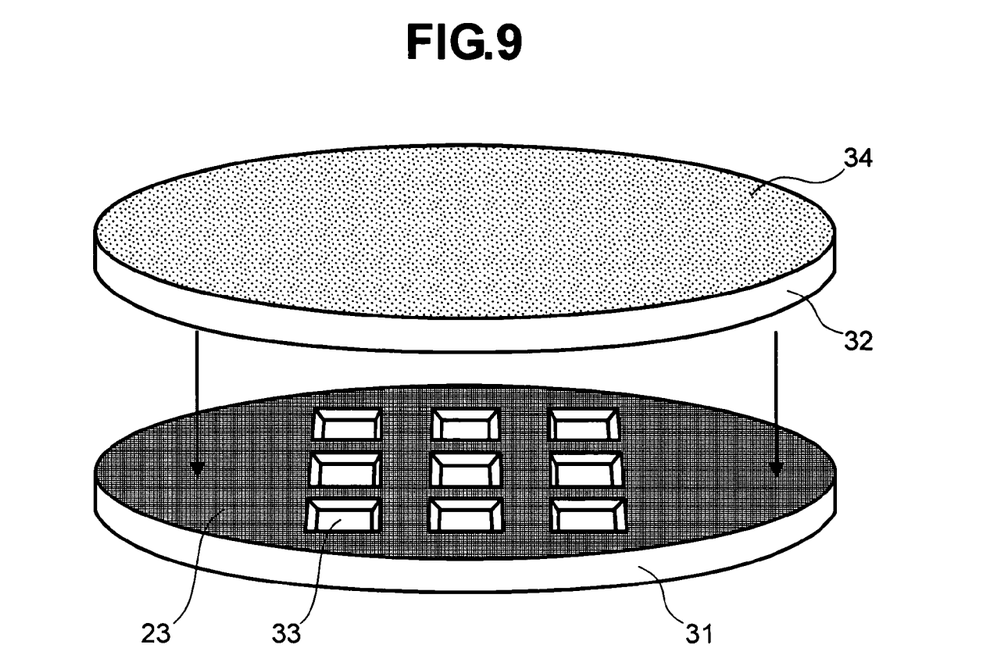
FIG. 9 is a developed perspective view illustrating a seventh embodiment in which the invention is applied to another product.

A seventh embodiment of the invention will be described with reference to FIG. 9. This embodiment relates to a circuit device (electronic device) having a structure wherein recesses are formed in a Si wafer by etching, optical devices are mounted inside of the recesses, respectively, and a thick portion of the Si wafer is anodically bonded to the glass, thereby sealing the insides of the recesses of the Si wafer.

At first, recesses 33 are formed by anisotropic etching in an Si wafer 31, and a metal film 23 for anodic bonding is formed at a portion of the Si wafer, other than the recesses 33, so that it is brought into contact with the glass substrate 32. When bonding is performed in the wafer state, it is sometimes difficult to obtain homogeneous and firm bonding over the entire wafer surface due to the effect of warping of the Si wafer 31, the dust which appears between the Si wafer 31 and the glass substrate 32 and the like. Thus, in accordance with this invention, when the metal film 23 for anodic bonding having a combination of a soft metal film and an active metal film, is formed on the Si substrate, the adhesivity is improved more than usual and homogeneous and firm bonding can be obtained over the entire wafer surface. In recent years, the size of wafers has become larger. Therefore, it was expected considered that degradation of the bonding quality caused by warping of the wafer or dust would become more of a problem in the future than usual. However, the present invention can provide firm bonding even when the size of the wafer increases.

Figure 10:
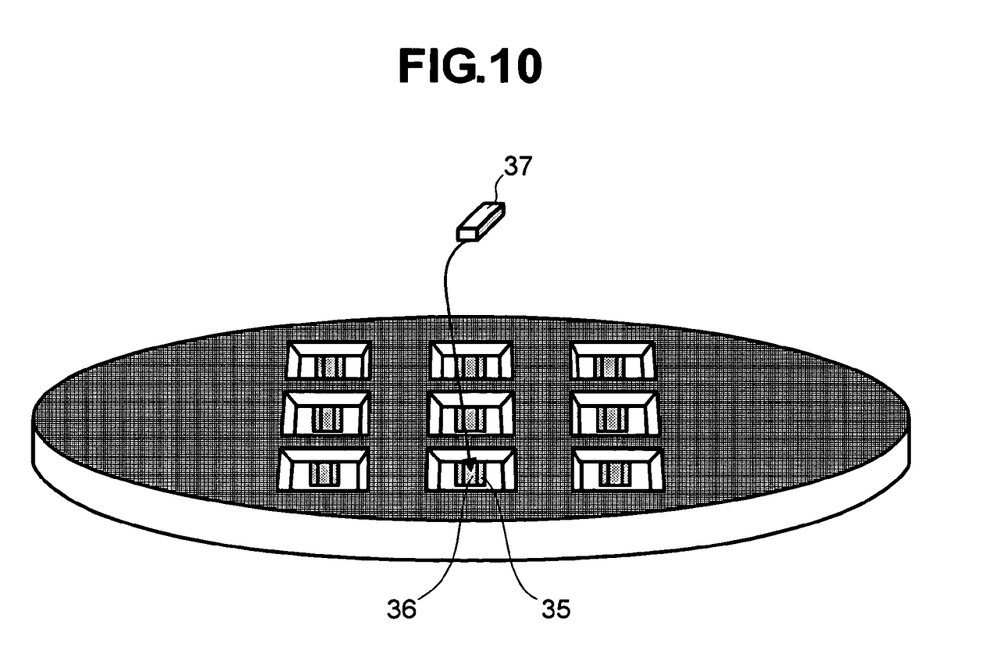
FIG. 10 is a perspective view illustrating another embodiment in which the invention is applied to another product.

When the metal film 23 for anodic bonding is formed, as shown in FIG. 10, an electrode metallized portion (optical device mounting electrode film) 35 for mounting the optical device can be formed simultaneously at the bottom of the recesses of the Si wafer, depending on the design of the mask pattern used in the thin film forming step. For example, a metallized portion, such as Ti or Pt, to be used for improving the adhesion between the soft metal layer and Si, is formed simultaneously by incorporating also an optical device mounting portion in the mask pattern. Then, when the Au layer is formed as a soft metal layer, an Au film having a thickness of about 0.5 µm is at first formed by the same mask as used for deposition of Ti, Pt, and lift-off is performed once in this step. Thus, Ti, Pt, Au (0.5 µm) are formed as the metal film 23 for anodic bonding and the electrode 35 for the mounting of optical devices on the Si substrate. Subsequently, a mask used exclusively for the metal film 23 for anodic bonding is formed separately to form a soft metal film layer and an active metal layer succeeding the Au deposition.

Then, thin film solder 36 for mounting the devices is formed on the electrode film 35 for optical device mounting. In this step, a mask used exclusively for a thin film solder is formed to form, for example, solder having a composition near Au-20Sn eutectic or Sn—Ag—Cu, Sn—Pb, Sn—Zn or Au-90Sn solder. The thickness of the solder is preferably within a range of about 1 to 5 µm, but this is not limitative.

A substrate for mounting the optical devices is completed by the processes described so far. In the next step, optical devices are mounted onto the wafer. There are two methods for mounting the optical devices. That is, a first one is a method in which the optical device is first pressed to the thin film solder for temporal fixation and, after all the optical devices are temporarily fixed, the entire wafer is heated for connection with the optical devices. A second one is a method of pressing optical devices individually to the melted thin film solder for mounting.

An advantage of the first method is that, since the optical devices are temporarily fixed without melting the solder, it is not necessary to give so much consideration to oxidation of the solder surface. However, a disadvantage is that the optical devices may sometimes be displaced from those predetermined positions upon melting of the solder, depending on the behavior of the solder.

An advantage of the second method is that, since the optical devices are reliably mounted on the molten solder during positioning, the devices have less tendency to move. A disadvantage is that, since the surface of the molten solder is oxidized to sometimes worsen the wetting of the solder, it is necessary, for example, to take a countermeasure in which the periphery is covered completely and the atmosphere is replaced with nitrogen or a reducing gas.

Both of the methods have advantages and disadvantages, but either of the methods is made acceptable by, for example, improving the device mounting apparatus.

As described above, when all of the optical devices 37 have been mounted on the mounting portions of the wafer, the glass is then bonded to the bonding metal film 23 by anodic bonding. In this case, the inside atmosphere of the recesses of the Si wafer can be completely replaced by an atmosphere of dry helium or nitrogen. This can also prevent the optical devices from being damaged by moisture. Further, the glass and the Si wafer are completely bonded by way of the anodic bonding metal film 23, so that intrusion of moisture from the periphery can be suppressed completely.

Power supply paths to the optical devices inside the recesses are ensured by previously applying groove fabrication by etching to the Si or glass and completely burying the insides with the conductor to form via holes.

Finally, a bonded block completed for the mounting of optical devices in the wafer state and sealing with the glass is cut individually by dicing. Since the sealing has already been completed, the optical devices are not damaged by cooling water during dicing. The steps are collectively shown in the flow chart of FIG. 11.

Figure 11:
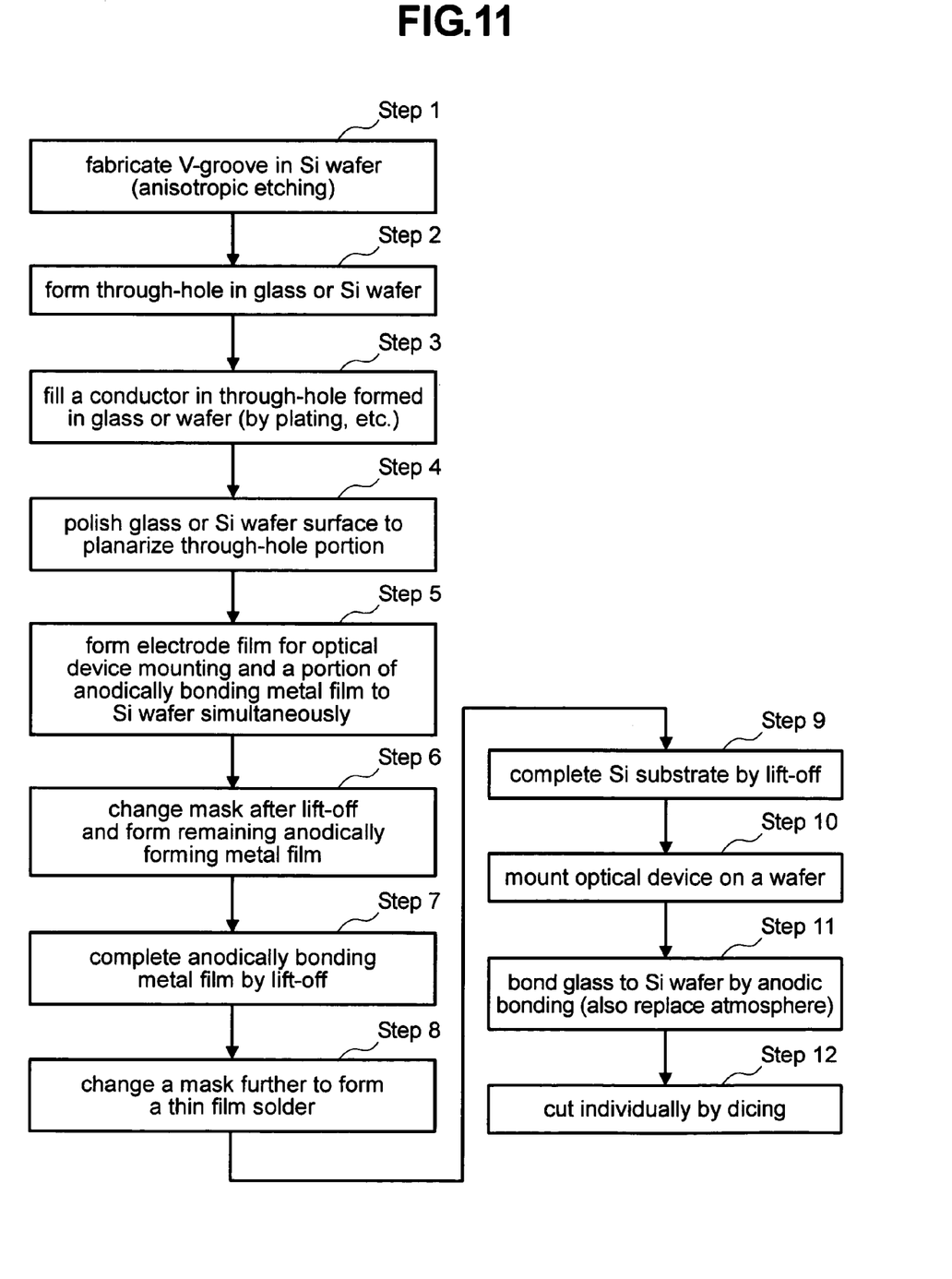
FIG. 11 is a flow chart illustrating the manufacturing steps employed in the fabrication of a product to which the invention is applied.

In FIG. 11, Step 1 is a Si wafer V-shaped-recess fabrication step; Step 2 is a step for forming a through-hole in the glass or the Si wafer; Step 3 is a conductor filling step for the glass or the Si wafer through-hole; Step 4 is a step of polishing the glass or Si wafer surface and planarizing the through-hole portion; Step 5 is a step of simultaneously forming an electrode film for optical device mounting and a portion of the metal film for anodic bonding; Step 6 is a step of changing a mask after lift-off and forming the remaining metal film for anodic bonding; Step 7 is a step for completing the anodic bonding metal film by lift off; Step 8 is a step of further changing a mask and forming a thin film solder; Step 9 is a completion step for the side of an Si substrate by lift-off; Step 10 is a step of mounting optical devices on a wafer; Step 11 is a step of bonding the glass to the Si wafer by anodic bonding; and Step 12 is a step of individual cutting by dicing.

As described above, optical components can be manufactured in the wafer state. A lens may be formed previously to an optical channel for the sealing glass. In a case of using a surface emission or surface incidence type optical device, a lens is located at the upper portion of an optical device. In a case of using an end face emission type optical device, light is reflected upwardly on the slope at the periphery of the bottom of a Si recess. Accordingly, in this case, a lens is located above the recess. A metallized portion can be applied to the slope by the mask design upon forming the electrode film 35, and this can provide a mirror surface by metallization.

By mounting optical devices in the wafer state by using the manufacturing steps described above and using the anodic bonding method according to the invention, encapsulation and lens mounting can be performed in the wafer state and handling and alignment in the manufactured steps can be decreased greatly, thereby to lower the production cost remarkably.

As described above, while the invention made by the present inventors has been described specifically with reference to the preferred embodiments, the invention is not limited to the embodiments described above, but can be modified variously within a range not departing the gist thereof.

Advantageous effects obtained by typical examples among those disclosed in the present application are simply described below.

According to the invention, when a conductor or semiconductor is bonded to glass by anodic bonding, even if dust is present therebetween or the undulation or warp appear in the wafer, they can be absorbed by the deformation of the soft metal film, so that firm bonding can be attained. Further, it is possible to previously roughen the bonded face on the side of the glass by utilizing the deformation of the soft metal, thereby improving the toughness of the bonding boundary. This can attain a high reliability for the bonding boundary. Further, in a case of bonding at a low temperature, it was generally difficult to obtain good adhesion between the conductor or the semiconductor and the glass and the bonding strength was lower compared with the bonding at high temperature. On the contrary, the invention can attain good adhesion even at a low temperature and obtain more firm bonding than usual.

In a case of applying the invention to products, positional displacement of the optical components can be prevented, thereby to manufacture optical components with a high degree of reliability. Further, by bonding the wafer or array-like components, the time for production can be shortened and the manufacturing cost can be reduced compared with the case of individual mounting.

What is claimed is:

1. An anodic bonding method comprising the steps of:
    forming a soft metal layer on a surface of a conductor layer or a semiconductor layer;
    forming an active metal layer on the soft metal layer, the active metal layer having a higher activity with oxygen than the soft metal layer; and
    heating the active metal layer and the glass layer that are brought into contact with each other while applying a DC voltage, using the conductor layer or the semiconductor layer as an anode and the glass layer as a cathode, between the anode and the cathode, thereby bonding the glass layer to the conductor layer or the semiconductor layer,
    wherein a metal layer comprising at least one of Al, Ti, Cr, V, and W is formed between the conductor layer or the semiconductor layer and the soft metal layer in order to improve adhesion therebetween, and a metal film comprising at least one of Cu, Ni, Pt, Pd, Ti, and Cr is formed between the soft metal layer and the active metal layer in order to prevent diffusion and reaction therebetween.

2. An anodic bonding method according to claim 1, wherein a pure metal film of Au, Ag, Cu, Ni, Pt, Pd, Pb, or Sn, or a stacked film of a plurality of the pure metals, or an alloy film thereof is used as the soft metal layer.

3. An anodic bonding method according to claim 1, wherein a pure metal film comprising at least one of Al, Cr, Ti, V, and W, or an alloy film containing at least one of the pure metals is used as the active metal film.

4. An anodic bonding method according to claim 1, wherein a bonded face of the glass layer is roughened.

5. An anodic bonding method according to claim 1, wherein a Si layer is used as the conductor layer or the semiconductor layer.

* * * * *